(12) United States Patent
Jang et al.

(10) Patent No.: US 11,437,574 B2
(45) Date of Patent: Sep. 6, 2022

(54) NON-VOLATILE RESISTIVE-SWITCHING MEMORY CONTAINING HALIDE PEROVSKITE MATERIAL AND METHOD FOR FABRICATING THE SAME

(71) Applicant: SEOUL UNIVERSITY R&DB FOUNDATION, Seoul (KR)

(72) Inventors: Ho Won Jang, Seoul (KR); Ji su Han, Ansan-si (KR); Hyojung Kim, Seoul (KR)

(73) Assignee: SEOUL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/239,723

(22) Filed: Jan. 4, 2019

(65) Prior Publication Data

US 2020/0194669 A1    Jun. 18, 2020

(30) Foreign Application Priority Data

Dec. 13, 2018  (KR) .......................... 10-2018-0161369
Dec. 13, 2018  (KR) .......................... 10-2018-0161370
Dec. 13, 2018  (KR) .......................... 10-2018-0161371

(51) Int. Cl.
*H01L 45/00* (2006.01)

(52) U.S. Cl.
CPC .......... *H01L 45/14* (2013.01); *H01L 45/1253* (2013.01); *H01L 45/1608* (2013.01)

(58) Field of Classification Search
CPC ............................ H01L 45/14; H01L 45/1608
See application file for complete search history.

(56) References Cited

U.S. PATENT DOCUMENTS

2014/0151623 A1* 6/2014 Jeon ...................... H01L 45/149
                                                              257/2
2019/0229266 A1* 7/2019 Jung ................... H01L 45/1233

FOREIGN PATENT DOCUMENTS

| KR | 10-0313253 B1 | 11/2001 |
| KR | 10-2010-0084790 A | 7/2010 |
| KR | 10-2013-0025010 A | 3/2013 |
| KR | 10-2014-0071813 A | 6/2014 |
| KR | 10-2017-0049758 A | 5/2017 |

(Continued)

OTHER PUBLICATIONS

J. S. Han et al., "Air-Stable Cesium Lead Iodide Perovskite for Ultra-Low Operating Voltage Resistive Switching," Advanced Functional Materials 2018, vol. 28, article No. 1705783. First published: Dec. 20, 2017. (Year: 2018).*

(Continued)

*Primary Examiner* — Peter M Albrecht
(74) *Attorney, Agent, or Firm* — NSIP Law

(57) ABSTRACT

Provided is a resistive-switching memory containing a positive electrode, a negative electrode and a resistive switching layer provided between the positive electrode and the negative electrode, the resistance of which is switched by an applied voltage, wherein the resistive switching layer contains a compound of the chemical formula $(A')_2A_{n-1}B_nX_{3n+1}$, wherein
A' is an ammonium ion having an asymmetric structure and containing a phenyl group, A is a monovalent metal ion and X is a halogen ion,
the A' has an asymmetric ion distribution which may be rotated by an applied electric field, and
n is a value between 1 and ∞.

8 Claims, 14 Drawing Sheets

(56) References Cited

FOREIGN PATENT DOCUMENTS

| KR | 20170049758 A | * | 5/2017 |
| KR | 101782379 B1 | * | 9/2017 |
| KR | 10-2017-0113453 A | | 10/2017 |

OTHER PUBLICATIONS

A. S. Dayan et al., "Enhancing Stability and Photostability of CsPbl3 by Reducing Its Dimensionality," Chemistry of Materials 2018, vol. 30, pp. 8017-8024. Published: Oct. 19, 2018. (Year: 2018).*

Tian, He, et al., "Cost-Effective, Transfer-Free, Flexible Resistive Random Access Memory 1 Using Laser-Scribed Reduced Graphene Oxide Patterning Technology," *Nano letters*, 14, 6, 2014 (pp. 3214-3219).

Korean Office Action dated Mar. 30, 2020 in counterpart Korean Patent Application No. 10-2018-0161370 (5 pages in Korean).

Korean Office Action dated Mar. 30, 2020 in counterpart Korean Patent Application No. 10-2018-0161371 (5 pages in Korean).

* cited by examiner

[FIG. 1]
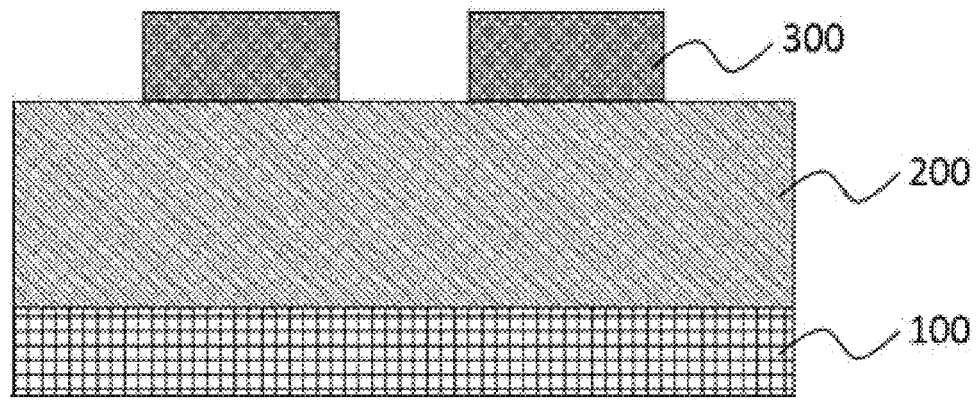
[FIG. 2]
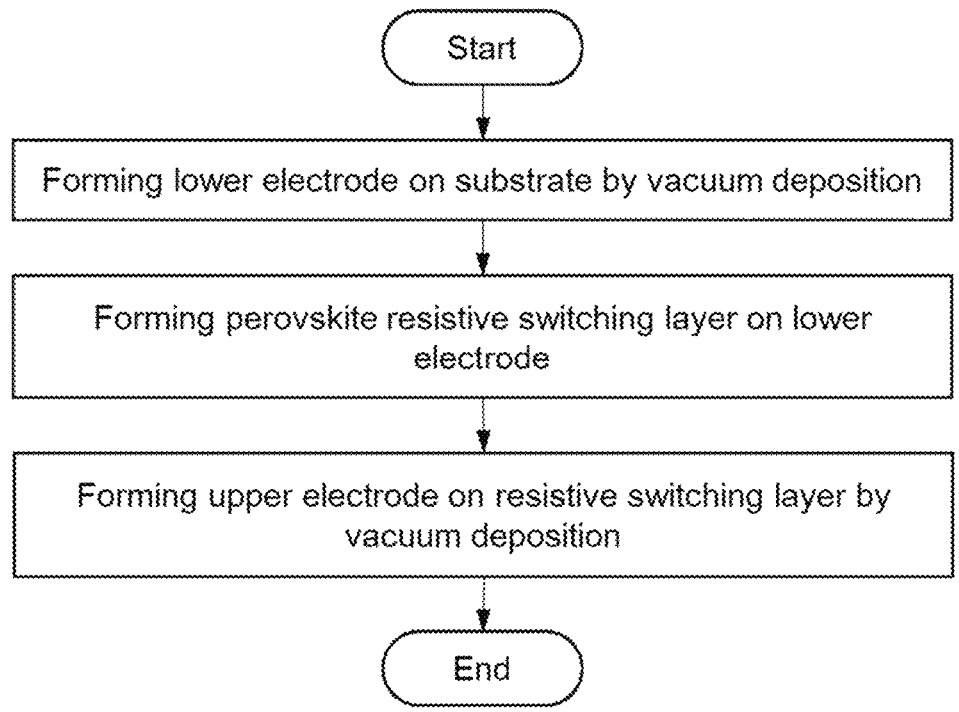

[FIG. 3]
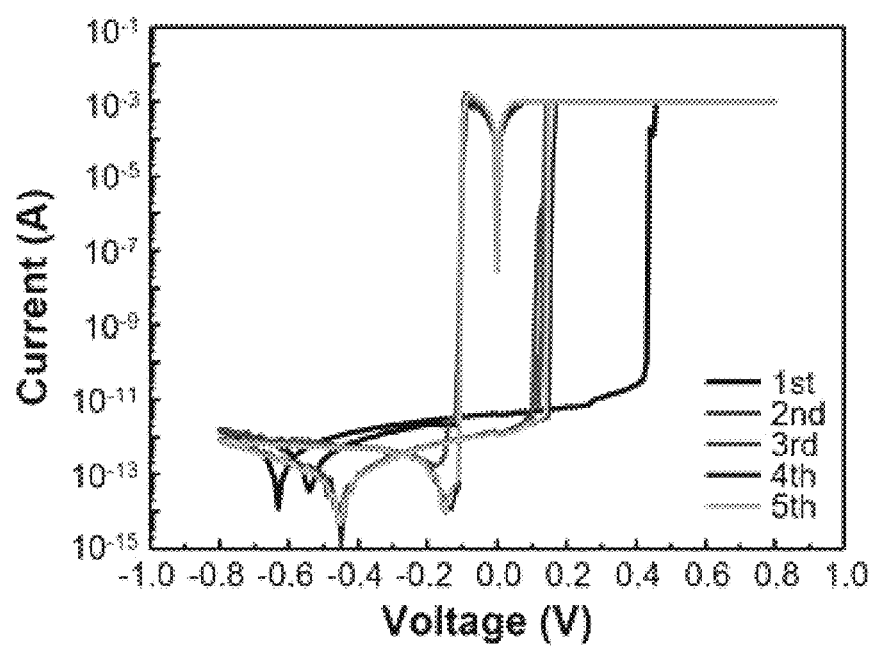

[FIG. 4]
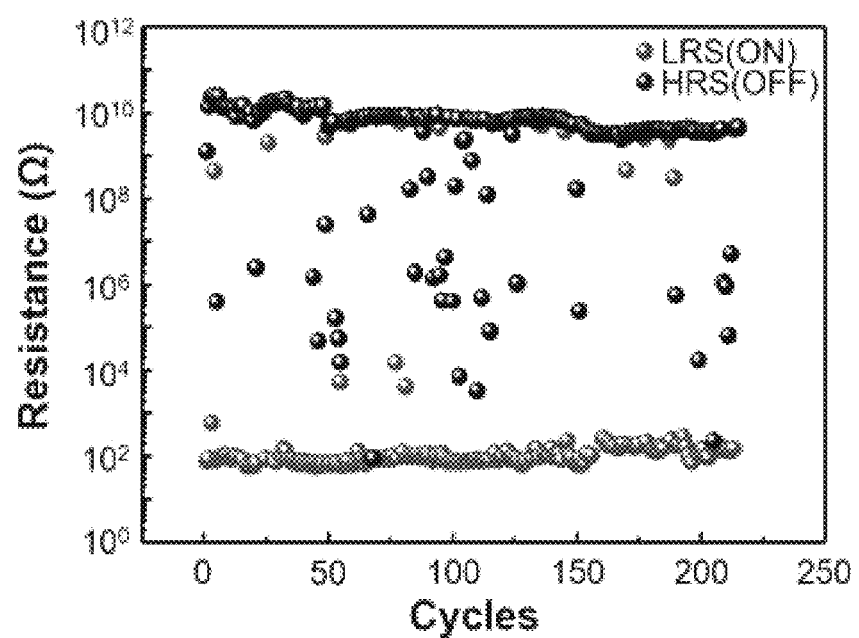

[FIG. 5]
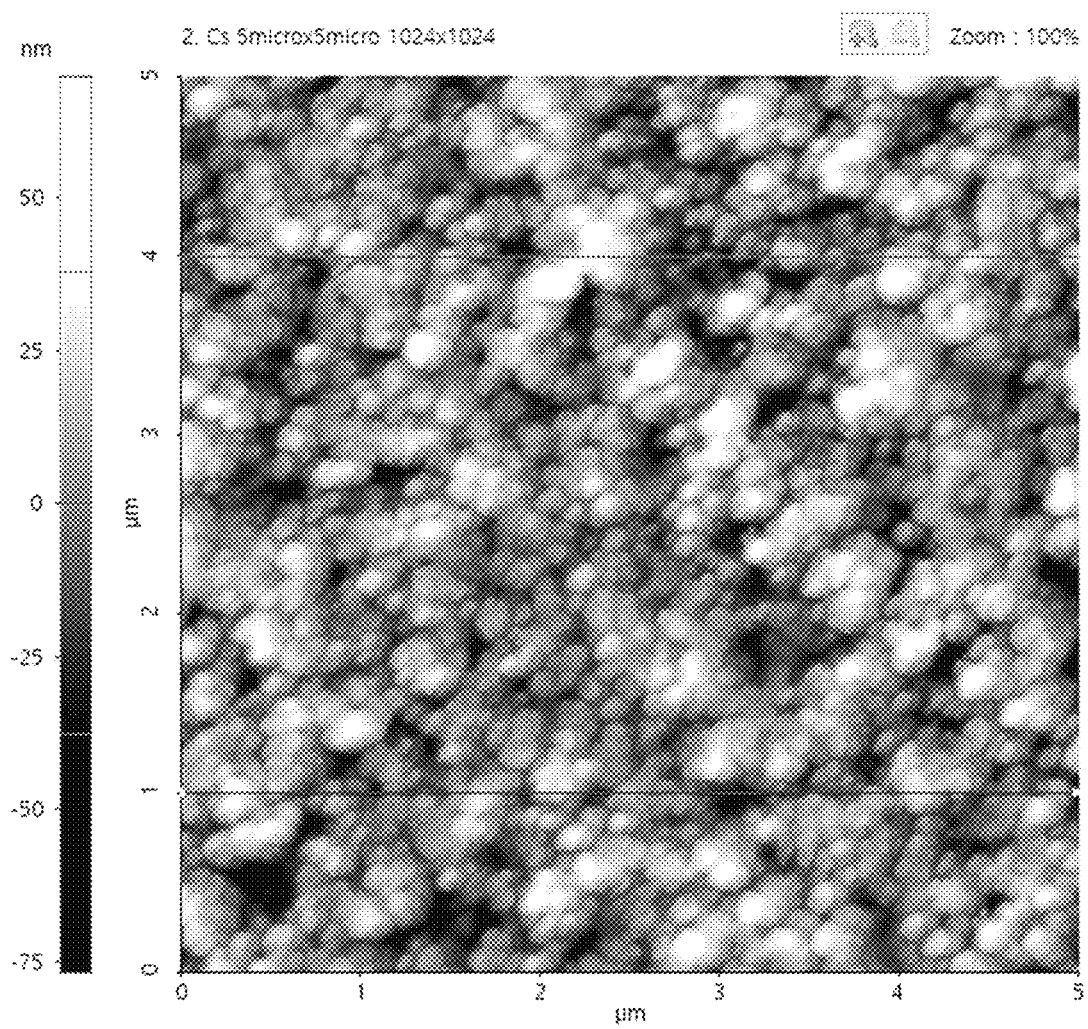
RMS: Ave. 15.0 nm

[FIG. 6]
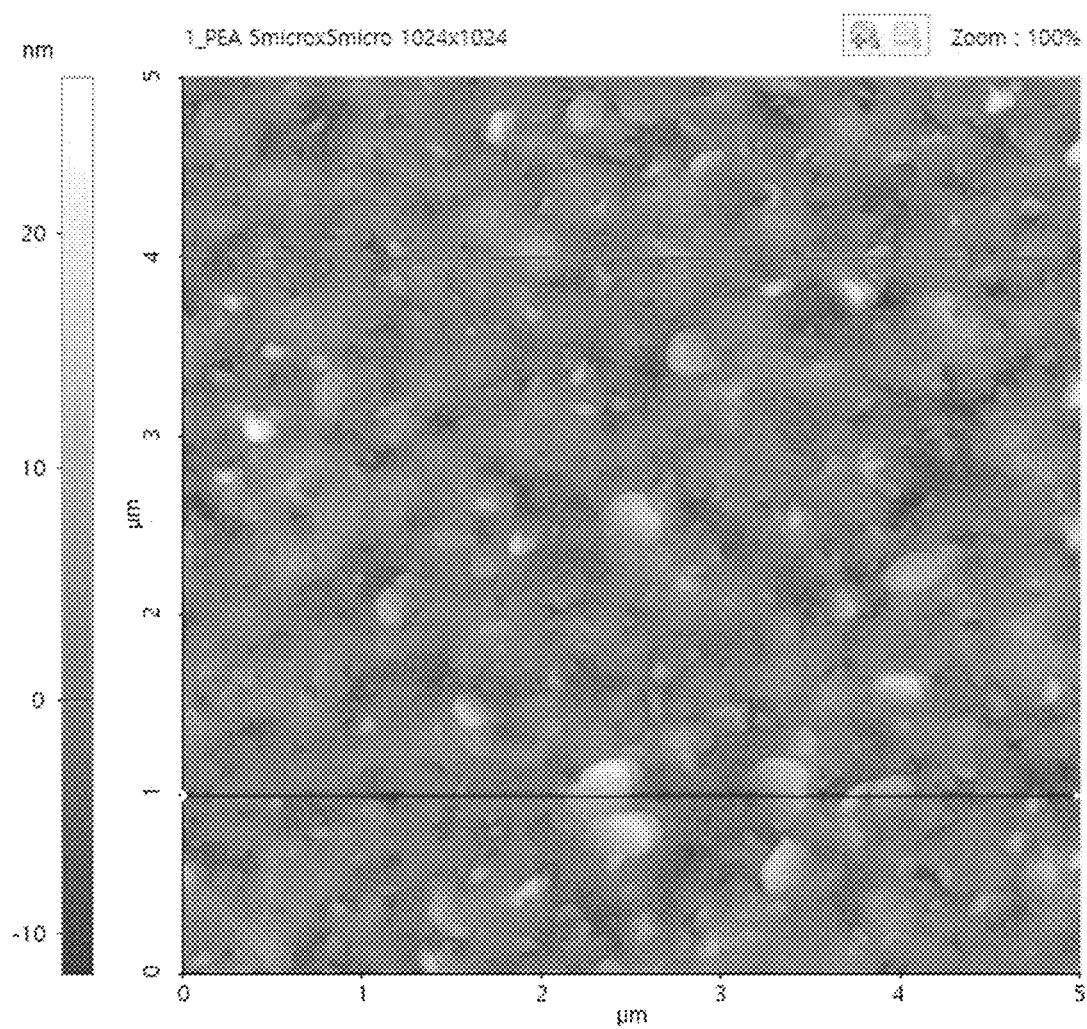
RMS: Ave. 3.0 nm

[FIG. 7]
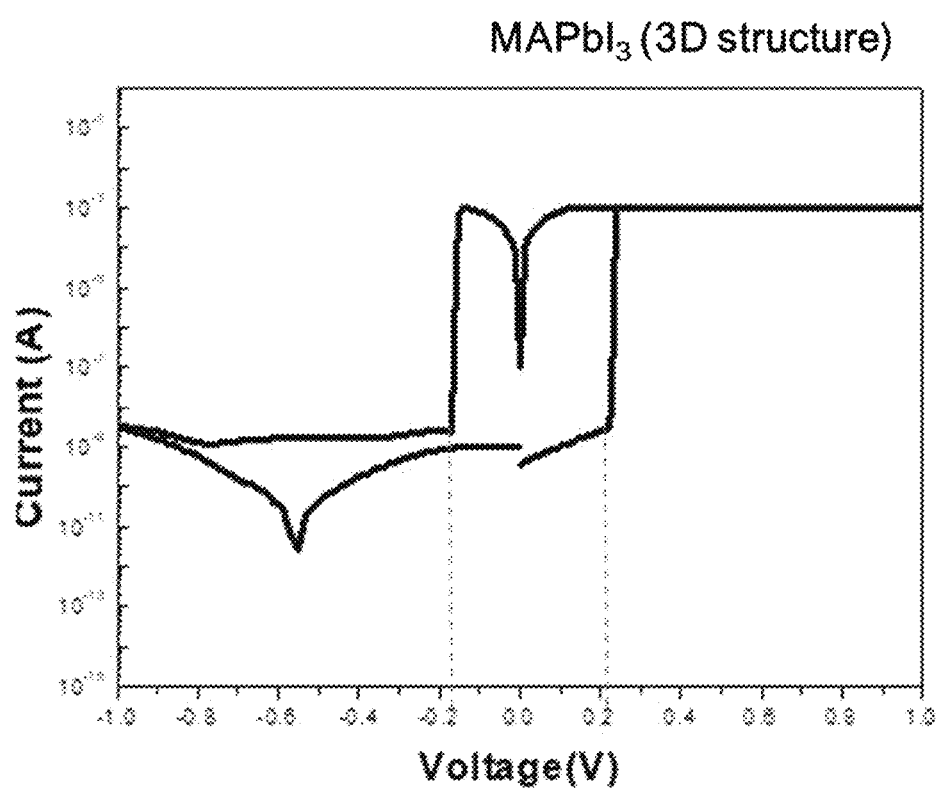

[FIG. 8]
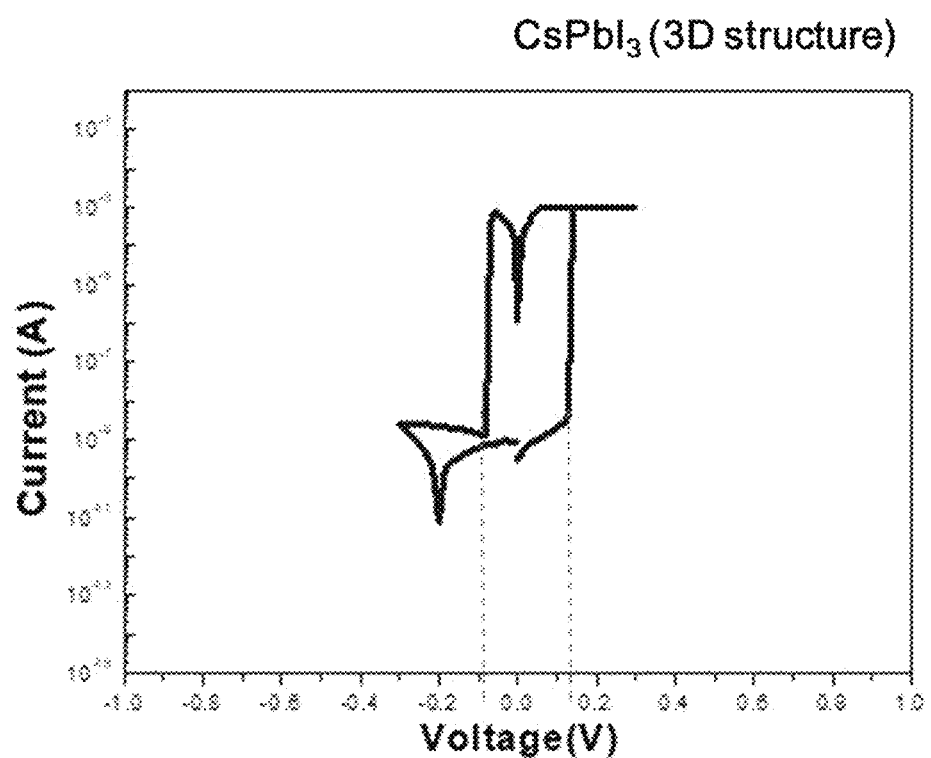

[FIG. 9]
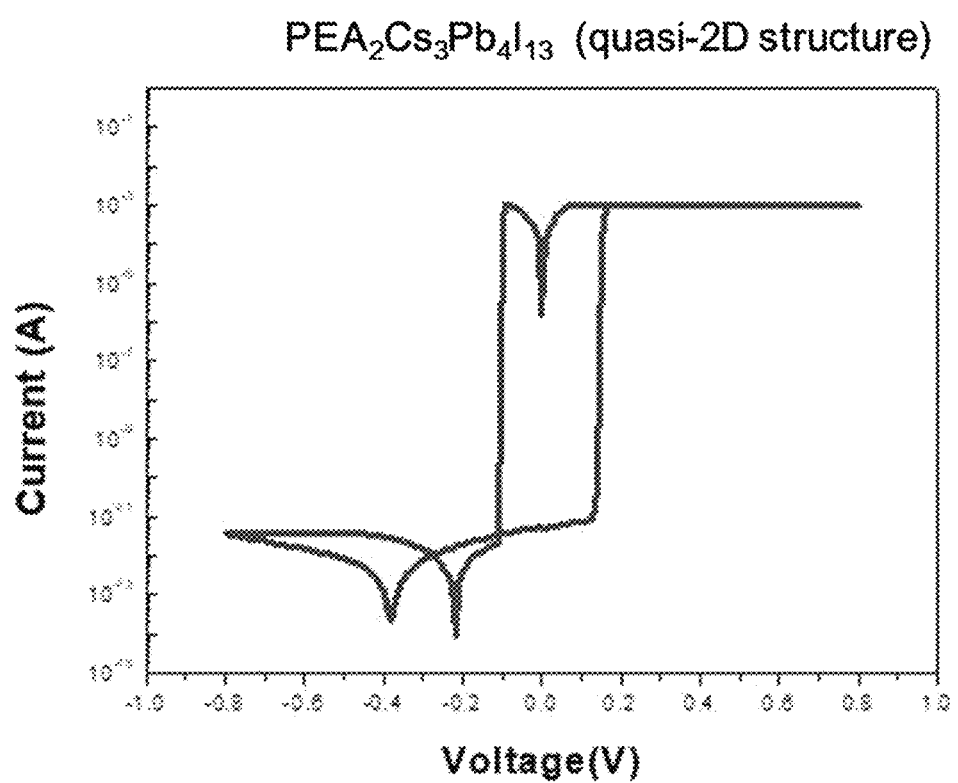

[FIG. 10]
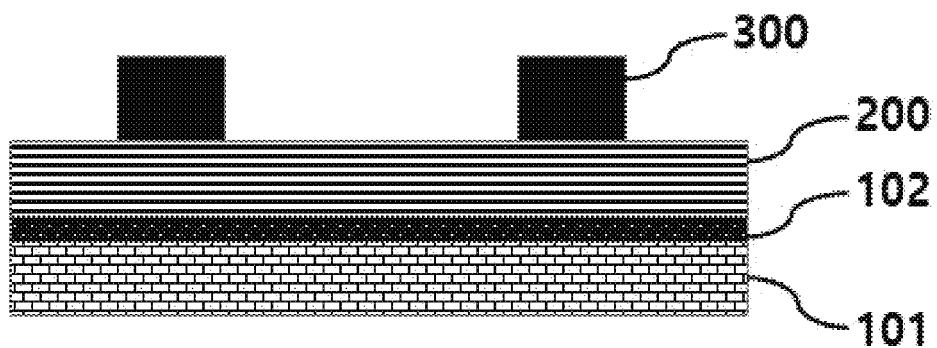
[FIG. 11]
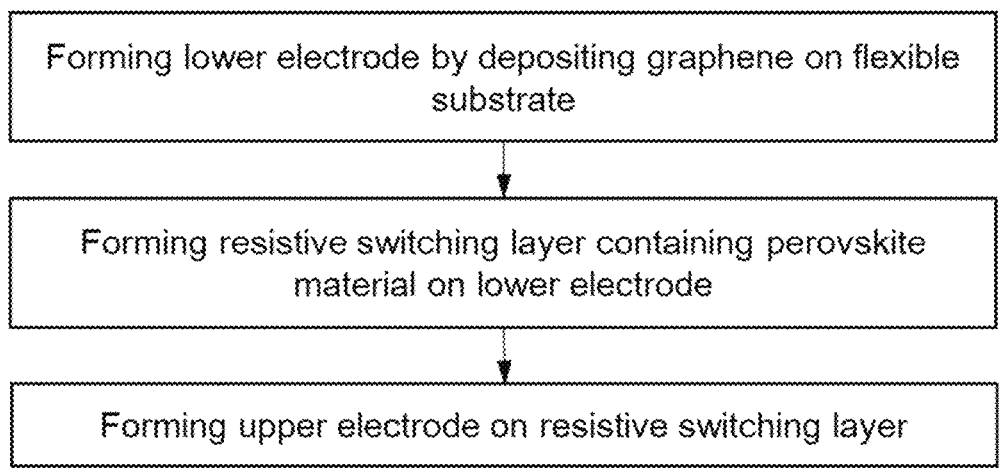

[FIG. 12]
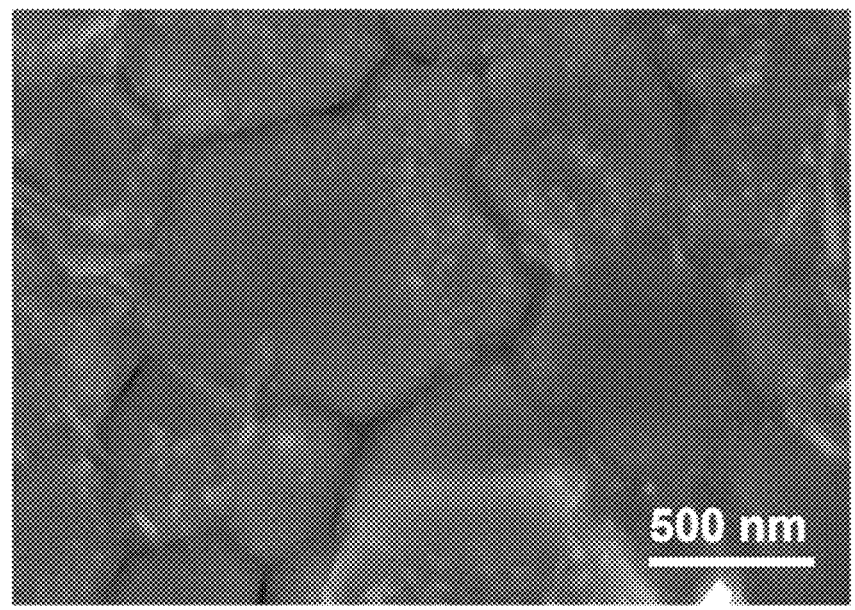
[FIG. 13]
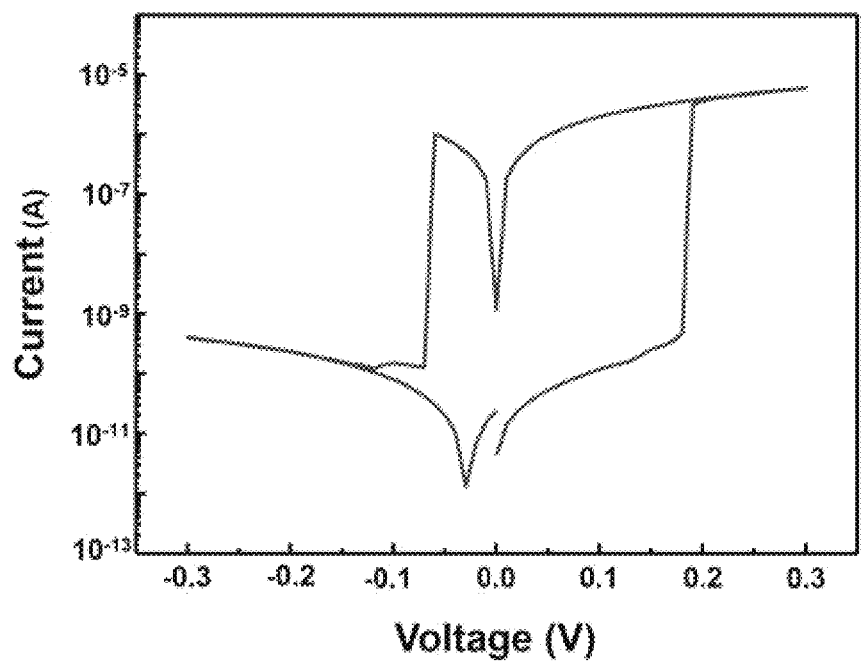

【FIG. 14】
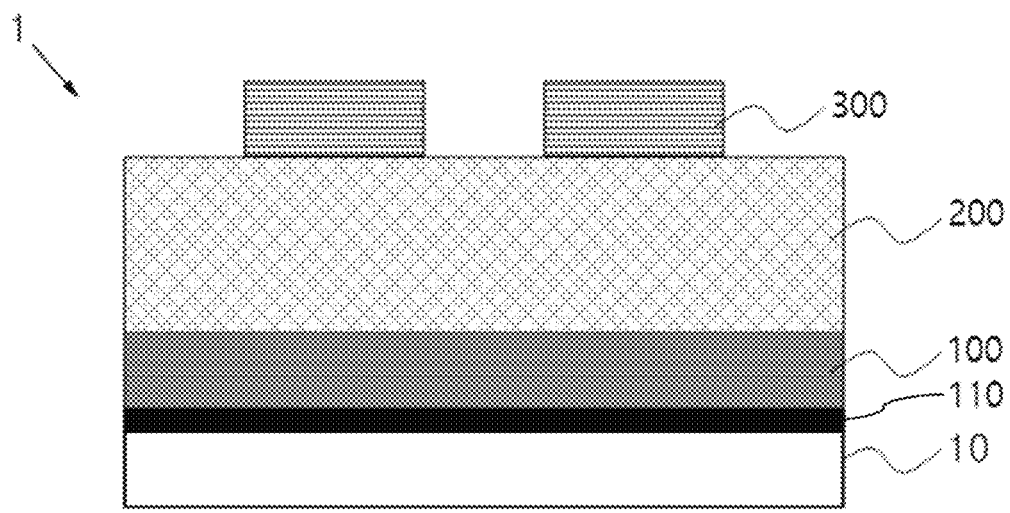
【FIG. 15】
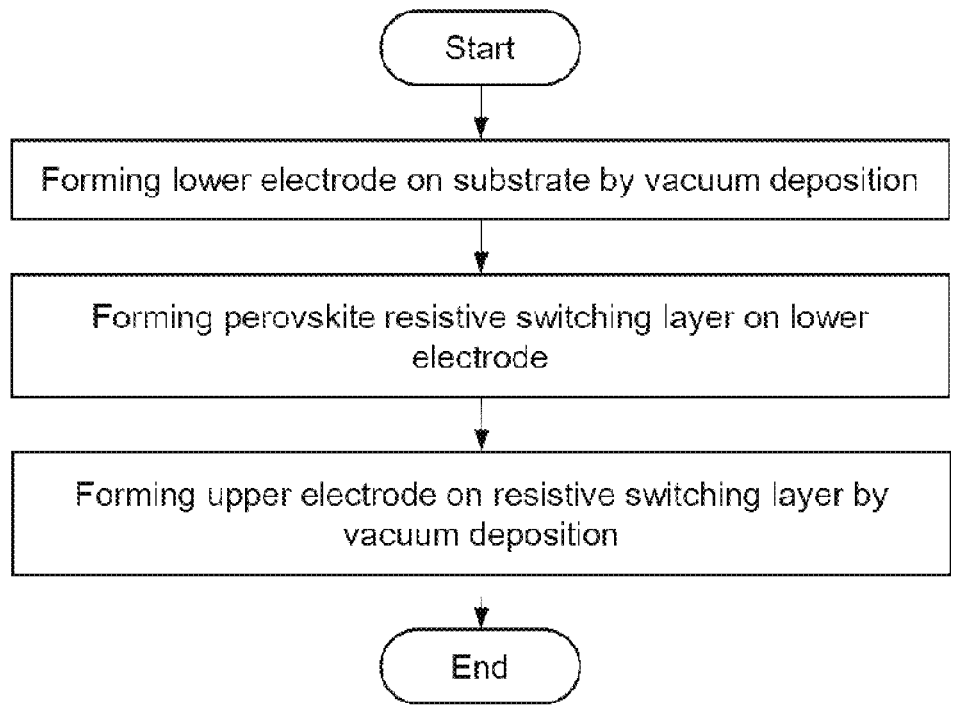

[FIG. 16]
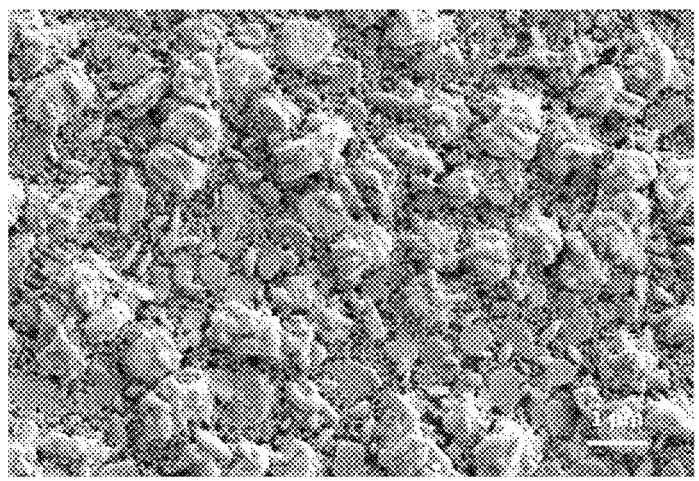
[FIG. 17]
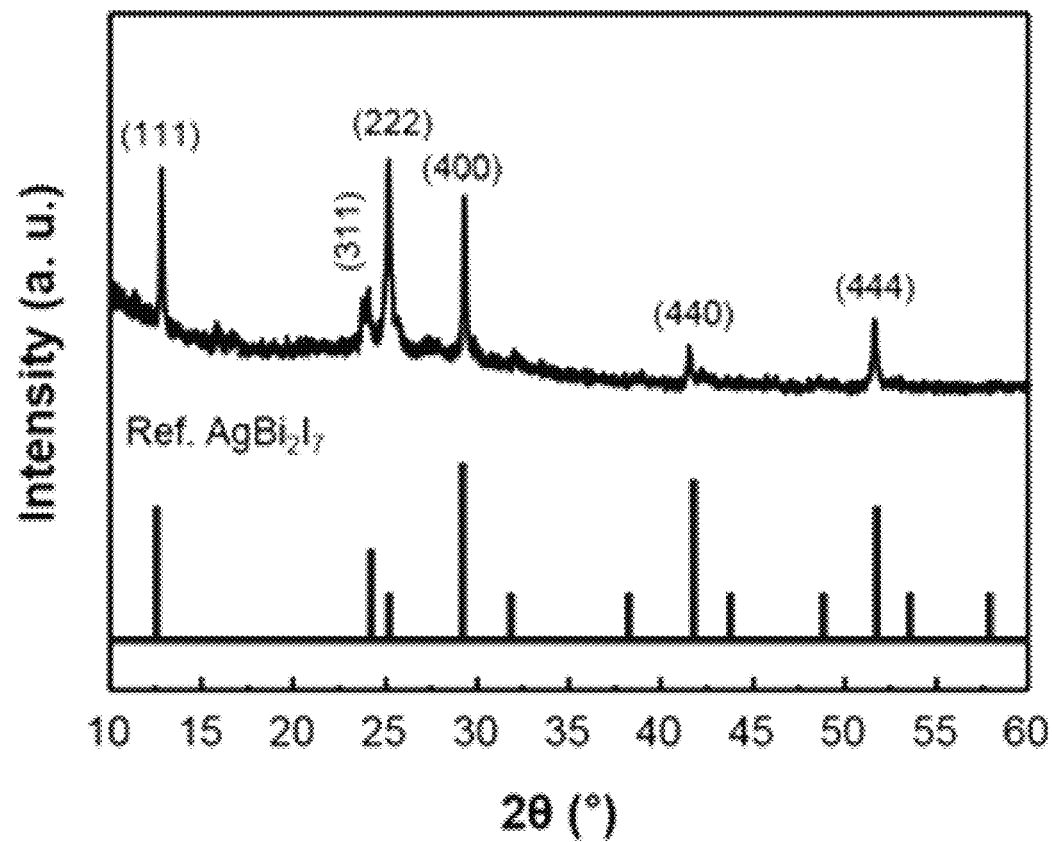

[FIG. 18]
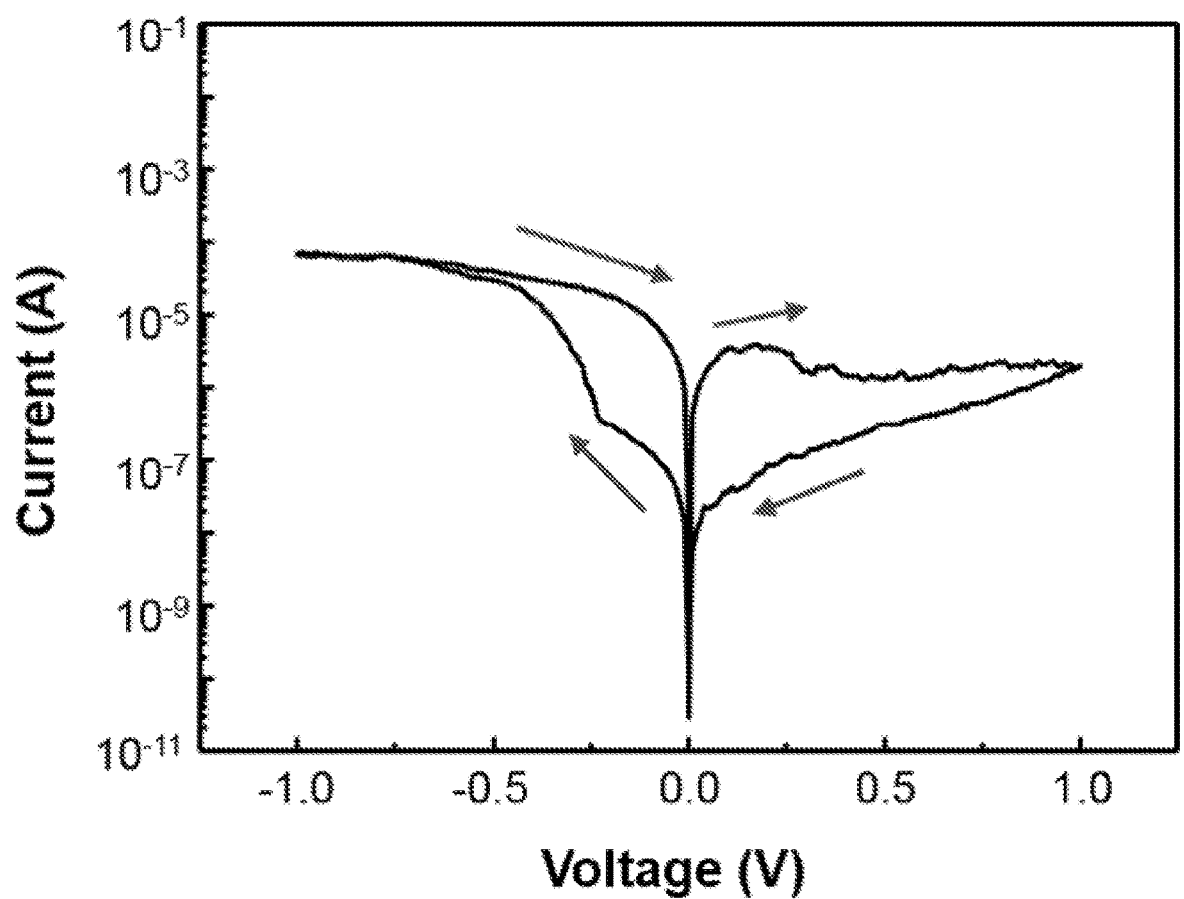

[FIG. 19]
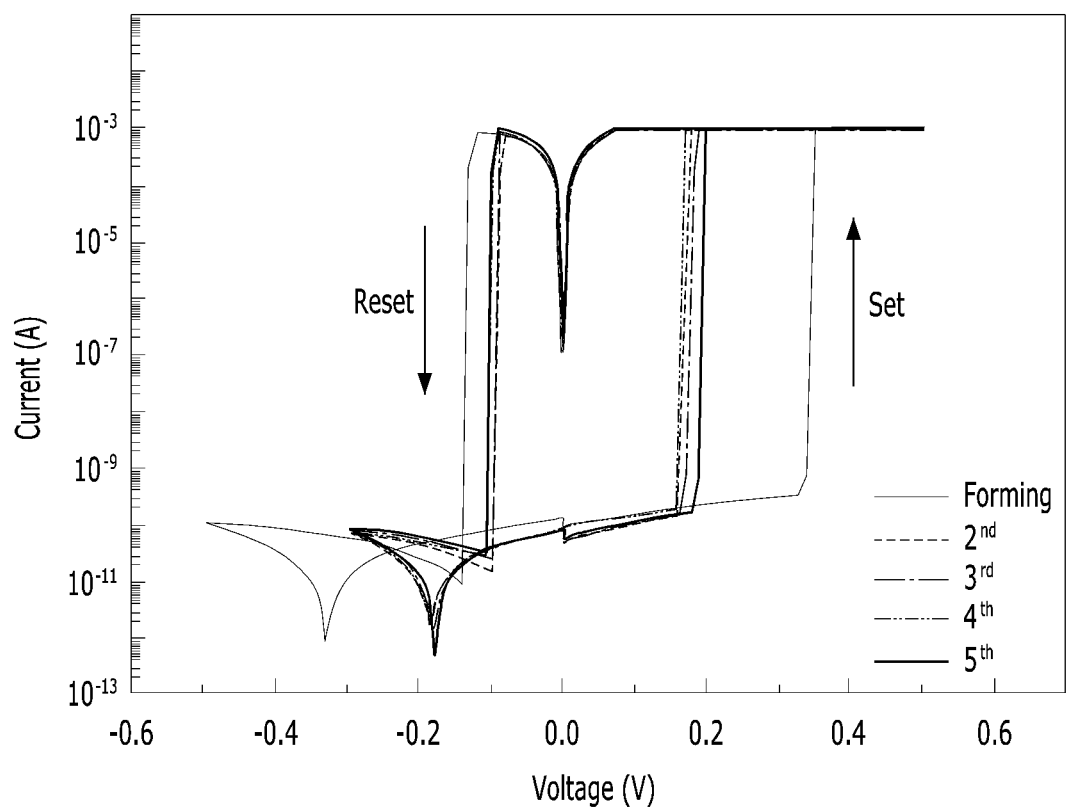

NON-VOLATILE RESISTIVE-SWITCHING MEMORY CONTAINING HALIDE PEROVSKITE MATERIAL AND METHOD FOR FABRICATING THE SAME

CROSS-REFERENCE TO RELATED APPLICATIONS

This application claims the benefit under 35 USC 119(a) of Korean Patent Application No. 10-2018-0161369 filed on Dec. 13, 2018, Korean Patent Application No. 10-2018-0161370 filed on Dec. 13, 2018, and Korean Patent Application No. 10-2018-0161371 filed on Dec. 13, 2018 in the Korean Intellectual Property Office, the entire disclosure of which is incorporated herein by reference for all purposes.

TECHNICAL FIELD

The present disclosure relates to a non-volatile resistive-switching memory containing a halide perovskite material and a method for fabricating the same, more particularly to a non-volatile resistive-switching memory containing a halide perovskite material of a layered structure, which exhibits remarkably improved electrical properties such as on-off resistance ratio, etc. as compared to the existing materials of a 3-dimensional structure, and a method for fabricating the same.

BACKGROUND ART

Resistive-switching memory (ReRAM) is drawing attentions as a promising non-volatile memory due to advantages such as low power consumption, high switching speed, etc.

In general, the resistive-switching memory uses an oxide-based inorganic material as a resistive switching layer. However, the oxide-based inorganic material is disadvantageous in that cost saving is difficult because a high-temperature vacuum environment is required and it is difficult to achieve a flexible memory.

In order to solve these problems, Korean Patent Application No. 10-2015-0150221 discloses a technology of using an organic metal halide having a perovskite crystal structure as a resistive switching layer. However, there are difficulties in commercialization due to low stability at room temperature, low on-off resistance ratio, etc.

DISCLOSURE

Technical Problem

The present disclosure is directed to providing a non-volatile resistive-switching memory based on a new material, which exhibits good stability at room temperature in the air and at the same time high on-off resistance ratio.

The present disclosure is also directed to providing a flexible resistive-switching memory and a method for fabricating the same.

The present disclosure is directed to providing a non-volatile resistive-switching memory using an inorganic-inorganic halide perovskite material, capable of resolving the disadvantages of the existing halide perovskite materials such as the decreased thermal durability of organic materials, environmental problems caused by the used of lead, etc.

Technical Solution

The present disclosure provides a resistive-switching memory containing a positive electrode, a negative electrode and a resistive switching layer provided between the positive electrode and the negative electrode, the resistance of which is switched by an applied voltage, wherein the resistive switching layer contains a compound of the chemical formula $(A')_2A_{n-1}B_nX_{3n+1}$.

wherein

A' is an ammonium ion having an asymmetric structure and containing a phenyl group, A is a monovalent metal ion and X is a halogen ion, the A' has an asymmetric ion distribution which may be rotated by an applied electric field, and n is a value between 1 and ∞.

In an exemplary embodiment of the present disclosure, the A may be Cs and the A' may be phenylethylammonium (PEA).

In an exemplary embodiment of the present disclosure, the resistive switching layer may contain a compound $PEA_2Cs_3Pb_4I_{13}$.

The present disclosure also provides a method for fabricating a resistive-switching memory, which includes: a step of forming a lower electrode on a substrate; a step of forming a resistive switching layer on the lower electrode; and a step of forming an upper electrode on the resistive switching layer, wherein the resistive switching layer has a layered structure, and the resistive switching layer contains a compound of the chemical formula $(A')_2A_{n-1}B_nX_{3n+1}$, wherein A' is an ammonium ion having an asymmetric structure and containing a phenyl group, A is a monovalent metal ion and X is a halogen ion, the A' has an asymmetric ion distribution which may be rotated by an applied electric field, and n is a value between 1 and ∞.

In an exemplary embodiment of the present disclosure, the A may be Cs and the A' may be phenylethylammonium (PEA).

In an exemplary embodiment of the present disclosure, the resistive switching layer may contain a compound $PEA_2Cs_3Pb_4I_{13}$.

The present disclosure also provides a non-volatile flexible resistive-switching memory, which contains: a flexible substrate, a lower electrode formed on the flexible substrate and containing a graphene layer; a switching layer formed on the graphene layer and containing a perovskite material; and an upper electrode formed on the resistive switching layer, wherein the lower electrode has flexible property.

In an exemplary embodiment of the present disclosure, the flexible substrate may be PET.

In an exemplary embodiment of the present disclosure, the graphene may be deposited on the flexible substrate by chemical vapor deposition.

In an exemplary embodiment of the present disclosure, the resistive switching layer may contain a halide perovskite material.

The present disclosure also provides a method for fabricating a non-volatile flexible resistive-switching memory, which includes: a step of forming a lower electrode by depositing graphene on a flexible substrate; a step of forming a resistive switching layer containing a perovskite material on the lower electrode; and a step of forming an upper electrode on the resistive switching layer.

In an exemplary embodiment of the present disclosure, the flexible substrate may be PET.

In an exemplary embodiment of the present disclosure, the graphene may be deposited on the flexible substrate by chemical vapor deposition.

In an exemplary embodiment of the present disclosure, the resistive switching layer may contain a halide perovskite material.

The present disclosure provides a non-volatile resistive-switching memory using an inorganic-inorganic halide perovskite material, which contains: a substrate; a lower electrode formed on the substrate; a resistive switching layer formed on the lower electrode; and an upper electrode formed on the resistive switching layer, wherein the resistive switching layer forms an $AB_2X_7$ perovskite structure as a first inorganic metal molecule, a second inorganic metal molecule and a halide molecule are bonded, wherein the A is silver (Ag), the B is chromium (Cr), manganese (Mn), iron (Fe), cobalt (Co), nickel (Ni), copper (Cu), zinc (Zn), gallium (Ga), indium (In), titanium (Ti), germanium (Ge), cadmium (Cd), hafnium (Hf), tin (Sn) or bismuth (Bi) and the X is fluorine (F), chlorine (CI), bromine (Br), iodine (I), sulfur (S) or selenium (Se).

The resistive switching layer may contain $AgBi_2I_7$.

The substrate may be one selected from a group consisting of silicon, metal foil, glass and polymer film.

The lower electrode may be one selected from a group consisting of platinum (Pt), gold (Au), iridium (Ir), tungsten (W), ITO (indium tin oxide) and graphene.

The upper electrode may be one selected from a group consisting of silver (Ag), copper (Cu), nickel (Ni), gold (Au) and platinum (Pt).

The present disclosure also provides a method for fabricating the non-volatile resistive-switching memory using an inorganic-inorganic halide perovskite material, which includes: a step of forming a lower electrode on a substrate; a step of forming a resistive switching layer on the lower electrode; and a step of forming an upper electrode on the resistive switching layer, wherein the resistive switching layer forms an $AB_2X_7$ perovskite structure as a first inorganic metal molecule, a second inorganic metal molecule and a halide molecule are bonded, wherein the A is silver (Ag), the B is chromium (Cr), manganese (Mn), iron (Fe), cobalt (Co), nickel (Ni), copper (Cu), zinc (Zn), gallium (Ga), indium (In), titanium (Ti), germanium (Ge), cadmium (Cd), hafnium (Hf), tin (Sn) or bismuth (Bi) and the X is fluorine (F), chlorine (CI), bromine (Br), iodine (I), sulfur (S) or selenium (Se).

Advantageous Effects

According to the present disclosure, a functional group having a cation of an asymmetric structure is added to a halide perovskite material to form a material of a layered structure. As a result, on-off ratio is improved as compared to the existing $CsPbI_3$-based memory and continuous switching for over 200 cycles is possible.

In addition, in the present disclosure, a 2-dimensional electrode material such as graphene is formed on a flexible substrate to constitute the lower electrode of the substrate as a flexible 2-dimensional electrode structure. Through this, a resistive-switching memory having flexible property can be fabricated.

In addition, a non-volatile resistive-switching memory according to the present disclosure, wherein a perovskite-based resistive-switching device without using an organic material or lead is used, is stable at high temperature and can minimize effect on the human body and the environment. Therefore, a high-integration non-volatile memory with excellent speed and durability while consuming less power may be fabricated.

BRIEF DESCRIPTION OF DRAWINGS

FIG. 1 is a cross-sectional view of a resistive-switching memory fabricated according to an exemplary embodiment of the present disclosure.

FIG. 2 illustrates a method for fabricating a resistive-switching memory according to an exemplary embodiment of the present disclosure.

FIG. 3 shows an I-V analysis result of a resistive-switching memory according to an exemplary embodiment of the present disclosure.

FIG. 4 shows a continuous resistive switching test result for a $Ag/PEA_2Cs_3Pb_4I_{13}/Pt$ memory.

FIGS. 5 and 6 respectively show AFM images when PEA was not used in a comparative example ($CsPbI_3$) and when PEA was used.

FIGS. 7-9 respectively show I-V curves when 3-dimensional perovskites ($MAPbI_3$, $CsPbI_3$) or a quasi-2-dimensional material according to the present disclosure were used for a resistive switching layer.

FIGS. 10 and 11 show a cross-sectional view of a flexible non-volatile memory according to an exemplary embodiment of the present disclosure and illustrate a method for fabricating the same.

FIG. 12 shows an SEM surface image of a halide perovskite resistive switching layer ($MAPbI_3$) thin film synthesized on graphene/PET according to an exemplary embodiment of the present disclosure.

FIG. 13 shows an IV sweep test result for a $Ag/MAPbI_3$/graphene/PET memory.

FIG. 14 schematically illustrates a non-volatile resistive-switching memory according to an exemplary embodiment of the present disclosure.

FIG. 15 shows a block diagram illustrating a method for fabricating a non-volatile resistive-switching memory according to an exemplary embodiment of the present disclosure.

FIG. 16 shows a scanning electron microscopic (SEM) image of a thin film layer of a non-volatile resistive-switching memory according to an exemplary embodiment of the present disclosure.

FIG. 17 shows an X-ray diffraction (XRD) graph of a thin film layer of a non-volatile resistive-switching memory according to an exemplary embodiment of the present disclosure.

FIG. 18 shows a current-voltage curve representing the resistive switching characteristics of a memory according to an exemplary embodiment of the present disclosure.

FIG. 19 shows a current-voltage curve of a resistive-switching memory ($Ag/CsPbI_3/Pt$) based on the existing inorganic-inorganic halide perovskite.

BEST MODE

Hereinafter, specific exemplary embodiments are described in detail referring to the attached drawings such that those of ordinary skill in the art to which the present disclosure belongs can easily carry out the present disclosure. But, in the description of the specific exemplary embodiments of the present disclosure, the detailed description of related well-known functions or constructions will be omitted if it is determined that they may unnecessarily obscure the gist of the present disclosure. Like reference numerals designate like elements throughout the present disclosure.

In addition, when a portion is described to be "connected" to another portion, it can be "directly connected" to the another portion or an intervening element may also be present therebetween. And, the term 'contain' specifies the presence of the stated element, but does not preclude the presence of other elements.

In the present disclosure, an organic cation having an asymmetric electron distribution (phenylethyleneammonium, PEA), which is capable of rotating at high speed in response to an applied voltage, is introduced to a perovskite material to achieve fast response and high on-off resistance ratio. Through this, a memory according to the present disclosure exhibits effective resistive switching even under a low electric field and exhibits a very high on-off ratio.

In particular, the present disclosure uses a quasi-2D perovskite material as a resistive switching layer and provides a resistive-switching memory containing a compound with the chemical formula $(A')_2A_{n-1}B_nX_{3n+1}$ (wherein A' is an ammonium ion having an asymmetric structure and containing a phenyl group, A is a monovalent metal ion and X is a halogen ion, the A' has an asymmetric ion distribution which may be rotated by an applied electric field, and n is a value between 1 and ∞).

FIG. 1 is a cross-sectional view of a resistive-switching memory fabricated according to an exemplary embodiment of the present disclosure and FIG. 2 illustrates a method for fabricating the same.

Referring to FIGS. 1 and 2, after forming a lower electrode (Pt) 100 by vacuum deposition of Ti and Pt on a substrate (not shown) in sequence, a halide perovskite resistive switching layer 200 is formed on the lower electrode through spin coating. Then, an upper electrode (Ag) 300 is formed thereon by vacuum deposition. Through this, a resistive-switching memory of a MIM (metal/insulator/metal) structure is fabricated.

A detailed fabrication method is as follows.

A $PEA_2Cs_3Pb_4I_{13}$ solution is prepared by stirring CsI, PEAI (phenylethylammonium Iodide) and $PbI_2$ powders for 2 hours in anhydrous DMF. As a comparative example, a $CsPbI_3$ solution is prepared by stirring CsI and $PbI_2$ powders in anhydrous DMF for 2 hours.

Then, the solution is spin-coated on a $Pt/Ti/SiO_2/Si$ substrate (lower electrode) and then annealed on a hot plate. Then, after cooling the resistive switching layer thin film to room temperature, silver is deposited by e-beam evaporation and an upper electrode is patterned using a shadow mask.

FIG. 3 shows an I-V sweep test result for the $PEA_2Cs_3Pb_4I_{13}/Pt$ memory.

Referring to FIG. 3, it can be seen that, when a direct voltage is applied to the upper electrode of the memory in the order of 0 V→+0.8 V→0 V→−0.8 V→0 V, the high resistance state (HRS, or low current state) of the device is switched to a low resistance state (LRS, or high current state). When the polarity of the voltage is reversed, the low resistance state is switched again to a high resistance state. In particular, it can be seen that the on-off resistance ratio of the memory is maximized from $10^6$ to $10^9 \Omega$ as compared to the existing $CsPbI_3$ (3D)-based memory. This seems to be derived from the layered effect and polarity effect of PEA.

FIG. 4 shows a continuous resistive switching test result for the $Ag/PEA_2Cs_3Pb_4I_{13}/Pt$ memory (alternating voltage applied for ON: +0.8 V, alternating voltage applied for OFF: −0.8 V).

Referring to FIG. 4, it can be seen that, when a direct voltage is applied to the upper electrode Ag of the memory in the order of 0 V→+0.8 V→0 V→−0.8 V→0 V, continuous switching for 230 or more cycles is possible from the low resistance state (LRS, or high current state) to the high resistance state (HRS, or low current state).

FIGS. 5 and 6 respectively show AFM images when PEA is not used in the comparative example ($CsPbI_3$) and when PEA is used.

Referring to FIGS. 5 and 6, it can be seen that a very uniform thin film can be prepared when PEA is used as compared when the existing 3D perovskite is used.

FIGS. 7-9 respectively show I-V curves when 3-dimensional perovskites ($MAPbI_3$, $CsPbI_3$) or a quasi-2-dimensional material according to the present disclosure are used for a resistive switching layer.

Referring to FIGS. 7-9, it can be seen that the on-off ratio is increased as the PEA cation is added.

In the present disclosure, the quasi-2D perovskite is formed by partially replacing Cs with PEA, which will be described in detail below.

In general, when a $RNH_3$ cation (e.g., PEA) is added to the $ABX_3$ structure, $(RNH_3)_2A_{n1}B_nX_{3n+1}$ is formed. A 2D perovskite is formed if n is 1 and a 3D perovskite is formed if n is infinity (see Small Methods 2018, 2, 1700310)

If n is a value between 1 and infinity, a quasi-2D intermediate material is formed. In the present disclosure, a quasi-2D perovskite with Cs partially replaced with PEA is used to improve on-off characteristics and morphology.

FIG. 10 shows a cross-sectional view of a flexible non-volatile memory according to the present disclosure.

Referring to FIG. 10, the flexible non-volatile memory according to an exemplary embodiment of the present disclosure contains graphene 102 deposited on a flexible substrate 101 as a lower electrode. That is to say, on a substrate which has flexible property such as PET but is inadequate to apply a voltage as an electrode, graphene 102 is deposited so as to enable the application of a voltage while maintaining the flexible property of the substrate. Thus, the resulting non-volatile resistive-switching memory is endowed with flexible property.

A perovskite material-based resistive switching layer 200 is formed on the graphene 102. In an exemplary embodiment of the present disclosure, the resistive switching layer 200 contains a halide perovskite material. In an exemplary embodiment of the present disclosure, $MAPbI_3$ is used as the resistive switching layer 200 but the scope of the present disclosure is not limited thereto.

An upper electrode 300 is provided on the resistive switching layer 200. In an exemplary embodiment of the present disclosure, silver (Ag) is used.

As described above, according to the present disclosure, a flexible memory can be fabricated by using graphene as a material for applying a voltage to the lower electrode on the flexible substrate such as PET, even in the absence of a hard metal thin film as the lower electrode.

FIG. 11 illustrates a method for fabricating the memory of FIG. 10.

Referring to FIG. 11, a method for fabricating a flexible non-volatile resistive-switching memory according to an exemplary embodiment of the present disclosure includes: a step of forming a lower electrode by depositing graphene on a flexible substrate; a step of forming a resistive switching layer containing a perovskite material on the lower electrode; and a step of forming an upper electrode on the resistive switching layer.

Hereinafter, the method for fabricating a resistive-switching memory according to an exemplary embodiment of the present disclosure is described in more detail.

In an exemplary embodiment of the present disclosure, $MAPbI_3$ is prepared as a resistive switching layer material using methylammonium (MA).

For this, MAI and PbI$_2$ are stirred in anhydrous DMF for 2 hours.

Then, the prepared solution is spin-coated on a graphene/PET (polyethylene terephthalate) substrate (lower electrode) and then annealed on a hot plate. Then, after cooling to room temperature, silver is deposited on the resistive switching layer thin film as an upper electrode by e-beam evaporation.

FIG. 12 shows an SEM surface image of a halide perovskite resistive switching layer (MAPbI$_3$) thin film synthesized on graphene/PET according to an exemplary embodiment of the present disclosure.

Referring to FIG. 12, it can be seen that the halide perovskite resistive switching layer is deposited well on the graphene with a thickness of about 400 nm.

FIG. 13 shows an IV sweep test result for the Ag/MAPbI$_3$/graphene/PET memory.

Referring to FIG. 13, it can be seen that, when a direct voltage is applied to the upper electrode of the memory in the order of 0 V→0.3 V→0 V→−0.3 V→0 V, the high resistance state (HRS, or low current state) of the device is switched to a low resistance state (LRS, or high current state). When the polarity of the voltage is reversed, the low resistance state is switched again to a high resistance state. Accordingly, it can be seen that a lower electrode capable of inducing the operation characteristics of the resistive-switching memory may be embodied effectively by depositing the graphene layer on the flexible substrate having insulating property such as PET. The memory according to an exemplary embodiment of the present disclosure has an on-off resistance ratio of 10$^5$ Ω.

FIG. 14 schematically illustrates a non-volatile resistive-switching memory according to an exemplary embodiment of the present disclosure and FIG. 15 shows a block diagram illustrating a method for fabricating a non-volatile resistive-switching memory according to an exemplary embodiment of the present disclosure.

Referring to FIG. 14, the present disclosure relates to a non-volatile resistive-switching memory using an inorganic-inorganic halide perovskite material, which contains: a substrate; a lower electrode formed on the substrate; a resistive switching layer formed on the lower electrode; and an upper electrode formed on the resistive switching layer, wherein the resistive switching layer forms an AB$_2$X$_7$ perovskite structure as a first inorganic metal molecule, a second inorganic metal molecule and a halide molecule are bonded, wherein the A is silver (Ag), the B is chromium (Cr), manganese (Mn), iron (Fe), cobalt (Co), nickel (Ni), copper (Cu), zinc (Zn), gallium (Ga), indium (In), titanium (Ti), germanium (Ge), cadmium (Cd), hafnium (Hf), tin (Sn) or bismuth (Bi) and the X is fluorine (F), chlorine (CI), bromine (Br), iodine (I), sulfur (S) or selenium (Se).

Specifically, the substrate 10 may be one selected from a group consisting of silicon, metal foil, glass and polymer film. In addition, a buffer layer 110 such as a silicon oxide film or a silicon nitride film may be formed on the substrate 10. In addition, when a flexible memory is desired, metal foil or polymer film may be used as the substrate 10. Particularly, a polymer film selected from a group consisting of hard-coated PET, polyimide and cycloolefin polymer (COP) film may be used.

Specifically, the lower electrode 100 may be one selected from a group consisting of platinum (Pt), gold (Au), iridium (Ir), tungsten (W), ITO (indium tin oxide) and graphene and may have a thickness of 30-60 nm. Also, a Ti thin film may be formed between the substrate 10 and the lower electrode 100 in order to improve adhesion between the substrate 10 and the lower electrode 100. If the thickness of the lower electrode 100 is smaller than 30 nm, the resistance switching characteristic may not be achieved due to insufficient current. And, if it exceeds 60 nm, current leakage may occur or the flexibility of the substrate may be negatively affected due to the increased electrode thickness.

Next, a resistive switching layer 200 having a perovskite structure is formed on the lower electrode 100 and heat-treated.

Specifically, the resistive switching layer 200 forms a perovskite structure as a first inorganic metal molecule, a second inorganic metal molecule and a halide molecule are bonded. The resistive switching layer 200 may be reversibly switched to one or more low resistance state(s) having a lower resistance value than the high resistance state by restricting the applied current.

Specifically, the resistive switching layer 200 may have an AB$_2$X$_7$ perovskite structure. Specifically, silver (Ag) may be used as the first inorganic metal molecule A and chromium (Cr), manganese (Mn), iron (Fe), cobalt (Co), nickel (Ni), copper (Cu), zinc (Zn), gallium (Ga), indium (In), titanium (Ti), germanium (Ge), cadmium (Cd), hafnium (Hf), tin (Sn) or bismuth (Bi) may be used as the second inorganic metal molecule B. As the halide molecule X, fluorine (F), chlorine (CI), bromine (Br), iodine (I), sulfur (S) or selenium (Se) may be used. More specifically, the AB$_2$X$_7$ perovskite may contain AgBi$_2$I$_7$.

The resistive switching layer 200 may be formed through a solution process or a sol-gel process such as casting, spin coating, doctor blading or printing or through a vacuum process such as co-evaporation. Specifically, it may be formed by spin coating.

In particular, when the resistive switching layer 200 is AgBi$_2$I$_7$, after preparing a precursor solution by dissolving a mixture of AgI powder and BiI$_3$ powder in a polar organic solvent and then adding HI to the precursor solution for phase stabilization, the resistive switching layer 200 may be formed through spin coating.

As the polar organic solvent, one selected from a group consisting of N,N-dimethylformamide (DMF), dimethyl sulfoxide (DMSO), dimethylacetamide, N-methyl-2-pyrrolidone (NMP), γ-butyrolactone and a mixture thereof may be used.

Specifically, the heat treatment may be performed at 40-250° C. for about 3 minutes. If the heat treatment temperature is below 40° C., the effect of heat treatment cannot be expected because the crystallite size of the resistive switching layer 200 having a perovskite structure is not increased due to the low temperature. And, if it exceeds 250° C., the resistive switching layer 200 having a perovskite structure may be decomposed.

Next, an upper electrode 300 may be formed on the resistive switching layer 200 through vacuum deposition, electron-beam deposition or sputtering deposition. The upper electrode may be one selected from a group consisting of silver (Ag), copper (Cu), nickel (Ni), gold (Au) and platinum (Pt). Specifically, a silver electrode may be used.

Referring to FIG. 15, the present disclosure relates to a method for fabricating a non-volatile resistive-switching memory using an inorganic-inorganic halide perovskite material, which includes: a step of forming a lower electrode on a substrate (S100); a step of forming a resistive switching layer on the lower electrode (S200); and a step of forming an upper electrode on the resistive switching layer (S300), wherein the resistive switching layer forms an AB$_2$X$_7$ perovskite structure as a first inorganic metal molecule, a second inorganic metal molecule and a halide molecule are bonded, wherein the A is silver (Ag), the B is chromium (Cr), manganese (Mn), iron (Fe), cobalt (Co), nickel (Ni), copper (Cu), zinc (Zn), gallium (Ga), indium (In), titanium (Ti), germanium (Ge), cadmium (Cd), hafnium (Hf), tin (Sn) or bismuth (Bi) and the X is fluorine (F), chlorine (CI), bromine (Br), iodine (I), sulfur (S) or selenium (Se).

Hereinafter, the present disclosure will be described in detail through an example. However, the following example is for illustrative purpose only and it will be apparent to those of ordinary skill in the art that the scope of the present disclosure is not limited by the example.

EXAMPLE

After depositing Ti on a silicon substrate to a thickness of 20 nm, Pt was deposited to a thickness of 30 nm to form a lower electrode.

After preparing a precursor solution of a $AgBi_2I_7$ thin film by mixing AgI powder and $BiI_3$ powder and then dissolving in N,N-dimethylformamide (DMF), HI was added to the precursor solution for phase stabilization. After spin-coating the precursor solution on the lower electrode, a resistive switching layer was formed by heat-treating at 100° C.

A resistive-switching memory was fabricated by forming an upper electrode on the resistive switching layer through vacuum deposition of silver.

FIG. 16 is a scanning electron microscopic (SEM) image showing the surface of the non-volatile resistive-switching memory 1 according to an exemplary embodiment of the present disclosure.

FIG. 17 shows an X-ray diffraction (XRD) graph of the resistive switching layer 200 of the non-volatile resistive-switching memory 1 according to an exemplary embodiment of the present disclosure.

The XRD measurement of the resistive switching layer 200 revealed that the perovskite phase with a $AgBi_2I_7$ cubic structure was synthesized.

FIG. 18 shows a current-voltage curve representing the resistive switching characteristics of the non-volatile resistive-switching memory 1 according to an exemplary embodiment of the present disclosure.

As seen from FIG. 18, when a direct voltage was applied to the memory 1 having the structure of $Ag/AgBi_2I_7/Pt/Ti/SiO_2/Si$ resistive switching layer 200 in the order of 0 V→−1.0 V→0 V→+1.0 V→0 V, the resistive switching from the high resistance state to the low resistance state was observed around −0.25 V. This result is opposite to that of the existing halide perovskite-based memory having a Ag upper electrode (see FIG. 19) and suggests that the resistive switching occurs due to the transport of the Ag element inside the halide perovskite.

The device exhibiting resistive switching due to the formation and short-circuit of Ag-conductive filaments caused by the transport of Ag is advantageous in term of low driving voltage and high on-off resistance ratio. According to the present disclosure, the device durability can be improved over the existing device because the resistive switching occurs due to the transport of the Ag element inside the resistive switching layer without reaction with the upper electrode.

Although specific exemplary embodiments of the present disclosure have been described in detail, it will be obvious to those of ordinary skill in the art that such description is provided only as specific exemplary embodiments and the scope of the present disclosure is not limited by them.

Accordingly, it is to be understood that the substantive scope of the present disclosure is defined by the appended claims and their equivalents.

DETAILED DESCRIPTION OF MAIN ELEMENTS

1: memory
10: substrate
100: lower electrode
101: flexible substrate 102: graphene
200: resistive switching layer
300: upper electrode

The invention claimed is:

1. A resistive-switching memory comprising:
    a substrate selected from the group consisting of silicon, metal foil, glass, and polymer film;
    a lower electrode comprising a graphene layer and disposed on the substrate;
    a resistive switching layer disposed directly on the lower electrode, where a resistance of the resistive switching layer is switched by an applied voltage; and
    an upper electrode disposed directly on the resistive switching layer,
    wherein the resistive switching layer comprises a compound of a chemical formula $(A')_2A_{n-1}Pb_nX_{3n+1}$,
    wherein
    A' is an ammonium ion having an asymmetric structure and comprising a phenyl group, A is a monovalent metal ion, and X is a halogen ion,
    A' has an asymmetric ion distribution which may be rotated by an applied electric field, and
    n is 4.

2. The resistive-switching memory according to claim 1, wherein A is a cesium and A' is phenylethylammonium (PEA).

3. The resistive-switching memory according to claim 1, wherein the resistive switching layer comprises a compound $PEA_2Cs_3Pb_4I_{13}$.

4. The resistive-switching memory according to claim 1, further comprising a buffer layer disposed on the substrate, wherein the buffer layer comprises a silicon oxide film or a silicon nitride film.

5. The resistive-switching memory according to claim 1, wherein the polymer film is selected from the group consisting of hard-coated polyethylene terephthalate (PET) film, polyimide film, and cycloolefin polymer (COP) film.

6. A method for fabricating the resistive-switching memory of claim 1 comprising:
    forming the lower electrode on the substrate;
    forming the resistive switching layer on and in direct contact with the lower electrode; and
    forming the upper electrode on and in direct contact with the resistive switching layer,
    wherein the resistive switching layer has a layered structure.

7. The method for fabricating the resistive-switching memory according to claim 6, wherein A is a cesium and A' is phenylethylammonium (PEA).

8. The method for fabricating the resistive-switching memory according to claim 6, wherein the resistive switching layer comprises a compound $PEA_2Cs_3Pb_4I_{13}$.

* * * * *